United States Patent
Suzuki et al.

(10) Patent No.: US 7,304,003 B2
(45) Date of Patent: Dec. 4, 2007

(54) OXIDIZING METHOD AND OXIDIZING UNIT FOR OBJECT TO BE PROCESSED

(75) Inventors: Keisuke Suzuki, Tokyo-To (JP);
Toshiyuki Ikeuchi, Tokyo-To (JP);
Kimiya Aoki, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 385 days.

(21) Appl. No.: 11/086,671

(22) Filed: Mar. 23, 2005

(65) Prior Publication Data

US 2005/0272269 A1    Dec. 8, 2005

(30) Foreign Application Priority Data

Mar. 24, 2004  (JP)  ............................. 2004-087378
Feb. 8, 2005   (JP)  ............................. 2005-032341

(51) Int. Cl.
*H01L 21/31* (2006.01)

(52) U.S. Cl. .................. 438/770; 438/773; 438/778; 438/787; 257/E21.282

(58) Field of Classification Search ................ 438/771, 438/773, 769; 257/E21.278, E21.282, E21.283, 257/E21.284
See application file for complete search history.

(56) References Cited

U.S. PATENT DOCUMENTS

| | | | |
|---|---|---|---|
| 6,037,273 A | 3/2000 | Gronet et al. | |
| 6,599,845 B2 | 7/2003 | Sato et al. | |
| 6,869,892 B1 | 3/2005 | Suzuki et al. | |
| 2002/0127873 A1* | 9/2002 | Sato et al. | .................. 438/770 |
| 2003/0224615 A1* | 12/2003 | Nishino et al. | ............. 438/758 |

FOREIGN PATENT DOCUMENTS

| | | |
|---|---|---|
| JP | 57-001232 | 1/1982 |
| JP | 03-140453 | 6/1991 |
| JP | 04-018727 | 1/1992 |
| JP | 2002-176052 | 6/2002 |
| JP | 2003-209063 | 7/2003 |

* cited by examiner

*Primary Examiner*—Michael Lebentritt
*Assistant Examiner*—Cheung Lee
(74) *Attorney, Agent, or Firm*—Smith, Gambrell & Russell, LLP

(57) ABSTRACT

An oxidizing method for an object to be processed according to the present invention includes: an arranging step of arranging a plurality of objects to be processed in a processing container whose inside can be vacuumed, the processing container having a predetermined length, a main supplying unit of an oxidative gas and a supplying unit of a reducing gas being provided at one end of the processing container, a sub supplying unit of the oxidative gas being provided on a way in a longitudinal direction of the processing container; an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere. In the atmosphere forming step, the oxidative gas is adapted to be supplied from the main supplying unit of the oxidative gas and the sub supplying unit of the oxidative gas.

7 Claims, 8 Drawing Sheets

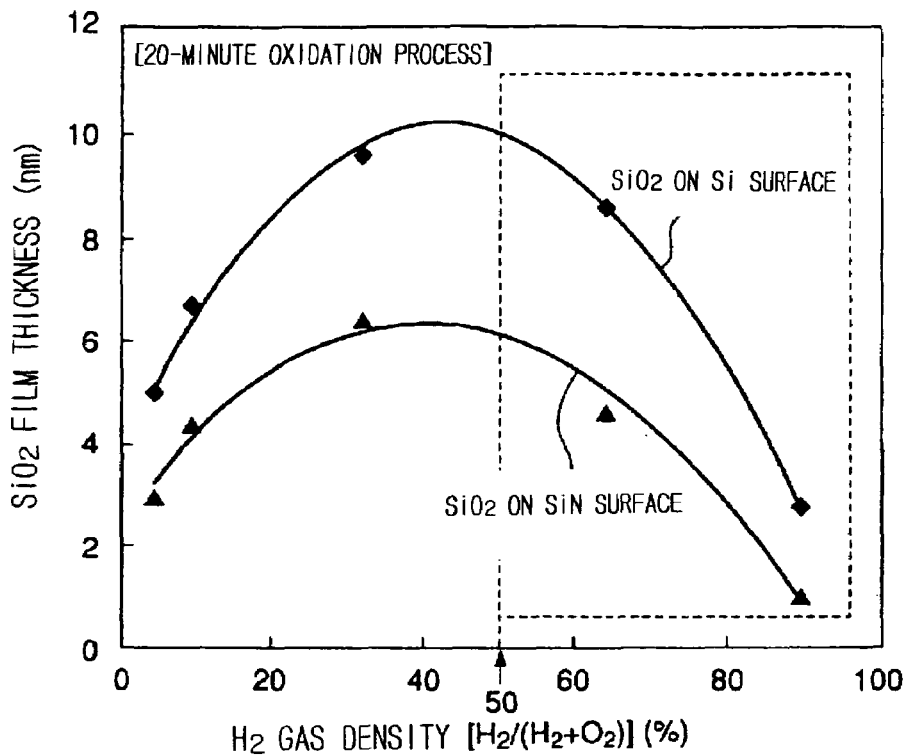
F I G. 6
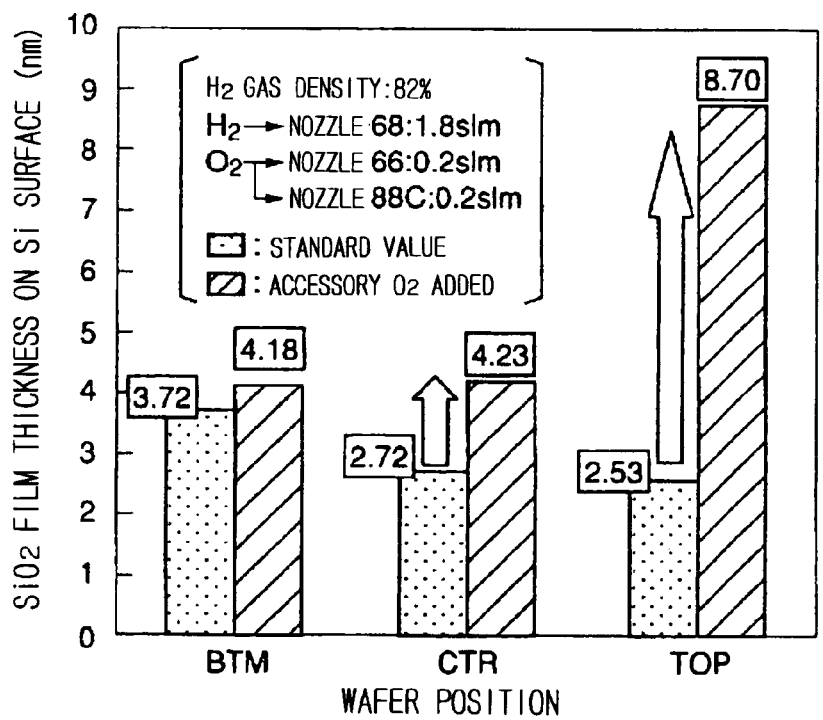
F I G. 7

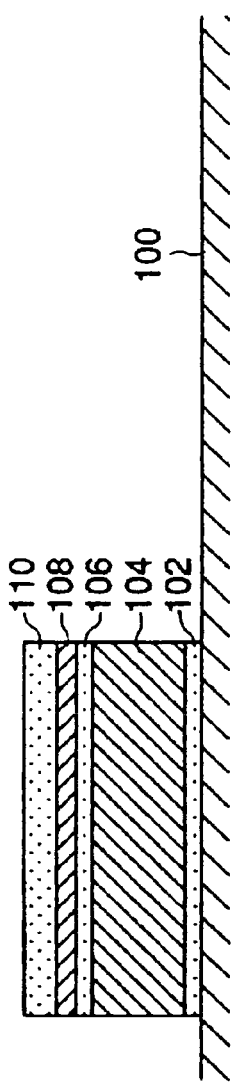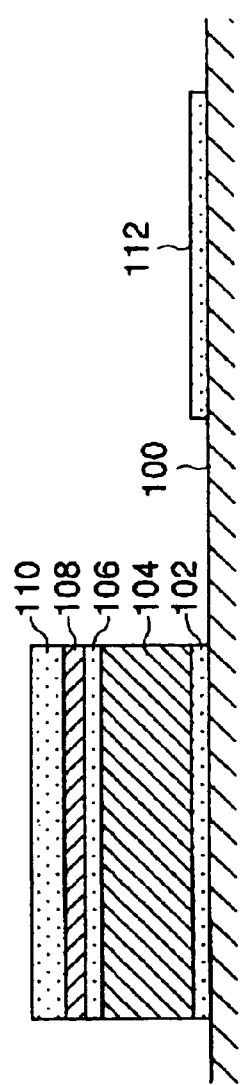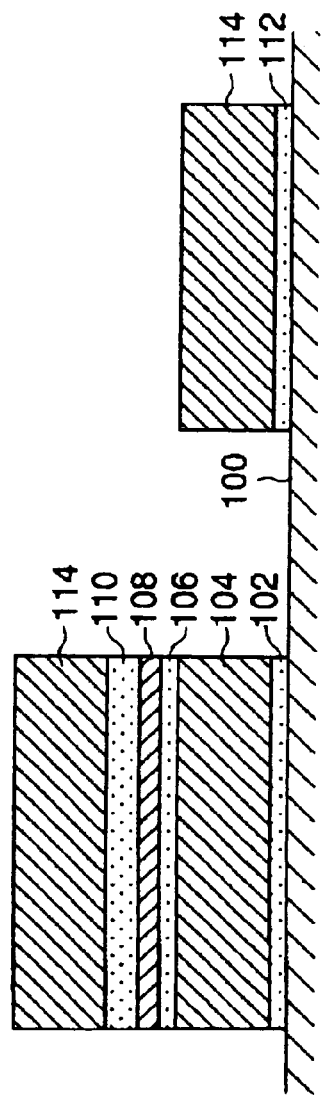

OXIDIZING METHOD AND OXIDIZING UNIT FOR OBJECT TO BE PROCESSED

FIELD OF THE INVENTION

This invention relates to an oxidizing method and an oxidizing unit for an object to be processed such as a semiconductor wafer or the like, which carries out an oxidation process to a surface of the object to be processed.

BACKGROUND ART

In general, in order to manufacture a desired semiconductor integrated circuit, various thermal processes including a film-forming process, an etching process, an oxidation process, a diffusion process, a modifying process or the like are carried out to a semiconductor wafer, which consists of a silicon substrate or the like. For example, as an oxidation process, there are known an oxidation process that oxidizes a surface of a single-crystal silicon film or a poly-silicon film, and another oxidation process that oxidizes a metal film, and so on. Such an oxidation process is mainly used for forming an insulation film such as a gate oxide film or a capacitor.

In view of a pressure, there are a normal-pressure oxidizing method that is carried out in a processing container under an atmosphere substantially the same as the atmospheric pressure, and a reduced-pressure oxidizing method that is carried out in a processing container under a vacuum. In addition, in view of a kind of gas used for the oxidation process, there are a wet oxidizing method that uses moisture vapor generated by burning hydrogen and oxygen by means of an outside burning unit (for example, JP A 3-140453), and a dry oxidizing method that causes only ozone or oxygen to flow into a processing container without using moisture vapor (for example, JP A 57-1232).

Herein, taking into consideration film characteristics as an insulation film such as pressure resistance, corrosion resistance, reliability or the like, in general, an insulation film formed by a wet oxidizing process is superior to an insulation film formed by a dry oxidizing process.

In addition, in general, an oxide film formed by a wet oxidizing process under a normal pressure can achieve a great oxidation rate, but is inferior in uniformity within a surface of a film thickness. On the other hand, an oxide film formed by a wet oxidizing process under a reduced pressure can achieve only a small oxidation rate, but is superior in uniformity within a surface of a film thickness.

Conventionally, design rules for a semiconductor integrated circuit were not so severe. Thus, the above various oxidizing methods were suitably selected taking into consideration use application of the oxide film, process condition for forming the oxide film, apparatus cost for forming the oxide film or the like.

However, recently, a wire width and/or a film thickness have been decreased so that the design rules for a semiconductor integrated circuit have become more severe. Thus, better film characteristics and/or higher uniformity within a surface of a film thickness have been required. The conventional oxidizing methods can not cope with the requests sufficiently.

An example of a wet oxidizing method is disclosed in JP A 4-18727. In this example, an $H_2$ gas and an $O_2$ gas are separately introduced into a lower-end portion of a longitudinal quartz reaction tube, and then burned at a burning part provided in a quartz cap. Moisture vapor is generated by the burning reaction. The moisture vapor rises up along an arrangement direction of wafers and oxidizes the wafers. In the case, the $H_2$ gas is burned at the burning part, so that the lower-end portion of the processing container becomes rich in the moisture vapor. As the moisture vapor rises up, the moisture vapor is consumed. Thus, to the contrary, an upper-end portion of the processing container becomes short in the moisture vapor. Thus, film thicknesses of the oxide films formed on the wafers may be greatly different depending on supporting positions of the wafers. That is, uniformity between surfaces of a film thickness of the oxide films may be deteriorated.

In addition, in an oxidizing unit disclosed in JP A 57-1232, a plurality of semiconductor wafers are arranged alongside in a horizontal batch type of reaction tube. An $O_2$ gas may be solely introduced into an end portion of the reaction tube. Alternatively, an $O_2$ gas and an $H_2$ gas may be simultaneously introduced thereinto. Then, an oxide film is generated under a reduced-pressure atmosphere. However, in the conventional unit, the film-forming process is carried out by using a hydrogen-burning oxidizing method under an atmosphere whose pressure is relatively high. That is, the moisture vapor is main in the reaction. Thus, as described above, density difference of the moisture vapor may be generated between an upstream side and a downstream side of the gases in the processing container. Thus, uniformity between surfaces of a film thickness of the oxide films may be deteriorated.

In addition, in a unit disclosed in the specification of U.S. Pat. No. 6,037,273, an oxygen gas and a hydrogen gas are supplied into a single-wafer type of process chamber, which is heated by a lamp. The both gases react in the vicinity of a surface of a semiconductor wafer arranged in the process chamber so as to generate moisture vapor. The moisture vapor oxidizes silicon of the wafer surface, so that an oxide film is formed.

However, in the unit as well, the oxygen gas and the hydrogen gas are introduced into the process chamber from gas ports which are located away from the wafer by about 20 to 30 mm, and the process pressure is relatively high. Thus, uniformity within a surface of a film thickness is inferior.

In order to solve the above problems, JP A 2002-176052 by the applicant discloses an oxidizing method wherein an oxidative gas such as an $O_2$ gas and an reducing gas such as an $H_2$ gas are simultaneously supplied into an upper portion and a lower portion of a process chamber respectively, and react on each other under a vacuum atmosphere in order to form an atmosphere mainly consisting of oxidation active species and active hydroxyl species. In that atmosphere, the silicon wafer or the like may be oxidized.

The oxidizing method is explained simply with reference to FIG. 11. FIG. 11 is a schematic structural view showing an example of a conventional oxidizing unit. The oxidizing unit 202 shown in FIG. 11 has a longitudinal cylindrical processing container 206. A resistance heater 204 is arranged around the processing container 206. In the processing container 206, a wafer boat 208 is arranged, which can be moved up and down in order to be loaded and unloaded through a lower end of the processing container 206. Semiconductor wafers W consisting of silicon substrates or the like are placed and held on the wafer boat 208 in a tier-like manner. An $H_2$-gas nozzle 210 for supplying an $H_2$ gas and an $O_2$-gas nozzle 212 for supplying an $O_2$ gas are provided at a lower side wall of the processing container 206. A gas-discharging port 214 connected to a vacuum pump not shown or the like is provided at an upper portion of the processing container 206.

The $H_2$ gas and the $O_2$ gas introduced into (a lower portion of) the processing container 206 from the both nozzles 210, 212 react on each other in the processing container 206, for example under a pressure smaller than 133 Pa, in order to generate active oxygen species and active hydroxyl species. These active species rise up in the processing container 206, come in contact with surfaces of the wafers W, and oxidize the surfaces.

According to the oxidizing methods disclosed in the above six documents, an oxide film having good film characteristics can be formed, and the uniformity within a surface of a film thickness of the oxide film can be maintained high.

Herein, recently, for a case wherein different materials are exposed on a surface of a semiconductor wafer, it has been requested that an oxide film having a good film quality is selectively formed on the wafer surface. For example, when a semiconductor integration circuit having a gate structure consisting of an ONO film, such as a flush memory, is manufactured, under a situation wherein both a silicon layer and a silicon nitride layer are exposed on a surface of a semiconductor wafer, it has been requested that an oxide film having a good film quality is selectively formed only on a silicon layer while an oxide film of $SiO_2$ is formed on the silicon nitride layer as little as possible. In the case, according to the above method using the active oxygen species and the active hydroxyl species in a simple manner, the oxidative effect is so strong that an oxide film of $SiO_2$ having a considerable thickness may be formed not only on the silicon layer but also on the silicon nitride layer. That is, a sufficient selective oxidation process can not be achieved.

The above point is explained in more detail with reference to FIGS. 12A to 12C. Each of FIGS. 12A to 12C is a view showing a part of a manufacturing method of a semiconductor integration circuit having a gate structure consisting of an ONO film. As shown in FIG. 12A, for example, in a gate structure for a flush memory, a first gate electrode 104 consisting of poly-crystal silicon is formed on a silicon substrate 100 via a gate oxide film 102. On the first gate electrode 104, an ONO film consisting of a three-layer structure of a silicon oxide film 106, a silicon nitride film 108 and a silicon oxide film 110 is formed.

During a forming step of such a gate structure, a gate oxide film 112 for a peripheral circuit element may be formed (see FIG. 12B). In the case, an oxidation process is conducted for forming the gate oxide film 112. Then, after the oxidation process, an electrode-forming process is conducted, so that a gate oxide film 112 for a peripheral circuit element is formed at the same time that a second gate electrode 114 for a flush memory is formed, as shown in FIG. 12C.

Herein, for the oxidation process for forming the gate oxide film 112 as shown in FIG. 12B, if a conventional low-pressure active-species oxidizing method that uses the active oxygen species and the active hydroxyl species in a simple manner is adopted, the silicon oxide film 110 at the uppermost part of the ONO film absorbs silicon atoms from the silicon nitride film 108 to be thickened, so that the silicon nitride film 108 may be made thinner. That is, there is a possibility that a designed ONO-film structure is not obtained.

SUMMARY OF THE INVENTION

This invention is developed by focusing the aforementioned problems in order to resolve them effectively. The object of this invention is to provide an oxidizing method and an oxidizing unit for an object to be processed, wherein a sufficient selective oxidation process can be conducted to different materials exposed on a surface of the object to be processed and wherein uniformity between surfaces of a film thickness of oxide films can be maintained high.

The inventor has found that a desired selective oxidation process is enabled by resupplying an oxidative gas (for example, an oxygen gas) partway of a reaction, and that thereby uniformity between surfaces of a film thickness of oxide films can be maintained high. The present invention has been created based on these findings.

The present invention is an oxidizing method for an object to be processed, the oxidizing method comprising: an arranging step of arranging a plurality of objects to be processed in a processing container whose inside can be vacuumed, the processing container having a predetermined length, a main supplying unit of an oxidative gas and a supplying unit of a reducing gas being provided at one end of the processing container, a sub supplying unit of the oxidative gas being provided on a way in a longitudinal direction of the processing container; an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere; wherein in the atmosphere forming step, the oxidative gas is adapted to be supplied from the main supplying unit of the oxidative gas and the sub supplying unit of the oxidative gas.

According to the invention, since the oxidative gas and the reducing gas are respectively supplied from the one end in the longitudinal direction of the processing container and the oxidative gas is also accessorily supplied on the way in the longitudinal direction of the processing container, uniformity between surfaces of a film thickness of formed oxide films can be maintained high. In addition, a sufficient selective oxidation process can be conducted to the object to be processed when different materials, for example a silicon layer and a silicon nitride layer, are exposed on a surface thereof.

Preferably, density of the reducing gas in total of the oxidative gas and the reducing gas is between 50% and 100%.

For example, the inside of the processing container is divided into at least three zones in the longitudinal direction, three sub supplying units of the oxidative gas are respectively provided for the three zones, and in the atmosphere forming step, the oxidative gas is adapted to be supplied from at least one of the main supplying unit of the oxidative gas and the three sub supplying units of the oxidative gas. In the case, preferably, in the atmosphere forming step, the three sub supplying units of the oxidative gas are adapted to be controlled independently from each other.

In addition, for example, the oxidative gas includes one or more gases selected from a group consisting of $O_2$, $N_2O$, NO, $NO_2$ and $O_3$, and the reducing gas includes one or more gases selected from a group consisting of $H_2$, $NH_3$, $CH_4$, HCl and deuterium.

In addition, the present invention is an oxidizing unit comprising: a processing container whose inside can be vacuumed, the processing container having a predetermined length; a main supplying unit of an oxidative gas provided at one end of the processing container; a supplying unit of a reducing gas provided at the one end of the processing container; a sub supplying unit of the oxidative gas provided on a way in a longitudinal direction of the processing container; and a holding unit that supports a plurality of objects to be processed at a predetermined pitch, and that can be arranged in the processing container.

According to the invention, since the oxidative gas and the reducing gas are respectively supplied from the one end in the longitudinal direction of the processing container and the oxidative gas is also accessorily supplied on the way in the longitudinal direction of the processing container, uniformity between surfaces of a film thickness of formed oxide films can be maintained high. In addition, a sufficient selective oxidation process can be conducted to the object to be processed when different materials, for example a silicon layer and a silicon nitride layer, are exposed on a surface thereof.

For example, the inside of the processing container is divided into a plurality of zones in the longitudinal direction, and a plurality of sub supplying units of the oxidative gas are respectively provided for the plurality of zones.

In the case, for example, the inside of the processing container is divided into a plurality of zones in the longitudinal direction at a predetermined pitch, and a plurality of sub supplying units of the oxidative gas are respectively provided for the plurality of zones.

Alternatively, for example, the inside of the processing container is divided into at least three zones in the longitudinal direction, and three sub supplying units of the oxidative gas are respectively provided for the three zones.

In addition, in the case, preferably, the plurality of sub supplying units of the oxidative gas is adapted to be controlled independently from each other.

In addition, for example, the oxidative gas includes one or more gases selected from a group consisting of $O_2$, $N_2O$, NO, $NO_2$ and $O_3$, and the reducing gas includes one or more gases selected from a group consisting of $H_2$, $NH_3$, $CH_4$, HCl and deuterium.

In addition, the present invention is a controlling unit for controlling an oxidizing unit including: a processing container whose inside can be vacuumed, the processing container having a predetermined length; a main supplying unit of an oxidative gas provided at one end of the processing container; a supplying unit of a reducing gas provided at the one end of the processing container; a sub supplying unit of the oxidative gas provided on a way in a longitudinal direction of the processing container; and a holding unit that supports a plurality of objects to be processed at a predetermined pitch, and that can be arranged in the processing container; the controlling unit being adapted to control the main supplying unit of the oxidative gas, the supplying unit of the reducing gas and the sub supplying unit of the oxidative gas in order to supply the oxidative gas and the reducing gas into the processing container in such a manner that an atmosphere having active oxygen species and active hydroxyl species is formed in the processing container.

Alternatively, the present invention is a program for controlling an oxidizing unit including: a processing container whose inside can be vacuumed, the processing container having a predetermined length; a main supplying unit of an oxidative gas provided at one end of the processing container; a supplying unit of a reducing gas provided at the one end of the processing container; a sub supplying unit of the oxidative gas provided on a way in a longitudinal direction of the processing container; and a holding unit that supports a plurality of objects to be processed at a predetermined pitch, and that can be arranged in the processing container; the program being adapted to cause a computer to execute a procedure of controlling the main supplying unit of the oxidative gas, the supplying unit of the reducing gas and the sub supplying unit of the oxidative gas in order to supply the oxidative gas and the reducing gas into the processing container in such a manner that an atmosphere having active oxygen species and active hydroxyl species is formed in the processing container.

Alternatively, the present invention is a storage medium capable of being read by a computer, storing the above program.

Alternatively, the present invention is a storage medium capable of being read by a computer, storing software for controlling an oxidizing method for an object to be processed, the oxidizing method comprising: an arranging step of arranging a plurality of objects to be processed in a processing container whose inside can be vacuumed, the processing container having a predetermined length, a main supplying unit of an oxidative gas and a supplying unit of a reducing gas being provided at one end of the processing container, a sub supplying unit of the oxidative gas being provided on a way in a longitudinal direction of the processing container; an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere; wherein in the atmosphere forming step, the oxidative gas is adapted to be supplied from the main supplying unit of the oxidative gas and the sub supplying unit of the oxidative gas.

BRIEF DESCRIPTION OF THE DRAWINGS

FIG. 6 is a graph showing dependency of film thicknesses of $SiO_2$ films on densities of an $H_2$ gas;

FIG. 7 is a graph showing changes of film thicknesses of $SiO_2$ films on Si surfaces at respective positions in the wafer boat;

FIGS. 12A to 12C are views respectively showing parts of a manufacturing method of a semiconductor integration circuit having a gate structure consisting of an ONO film.

DESCRIPTION OF THE PREFERRED EMBODIMENT

Hereinafter, an embodiment of an oxidizing method and an oxidizing unit according to the present invention is explained with reference to attached drawings.

Figure 1:
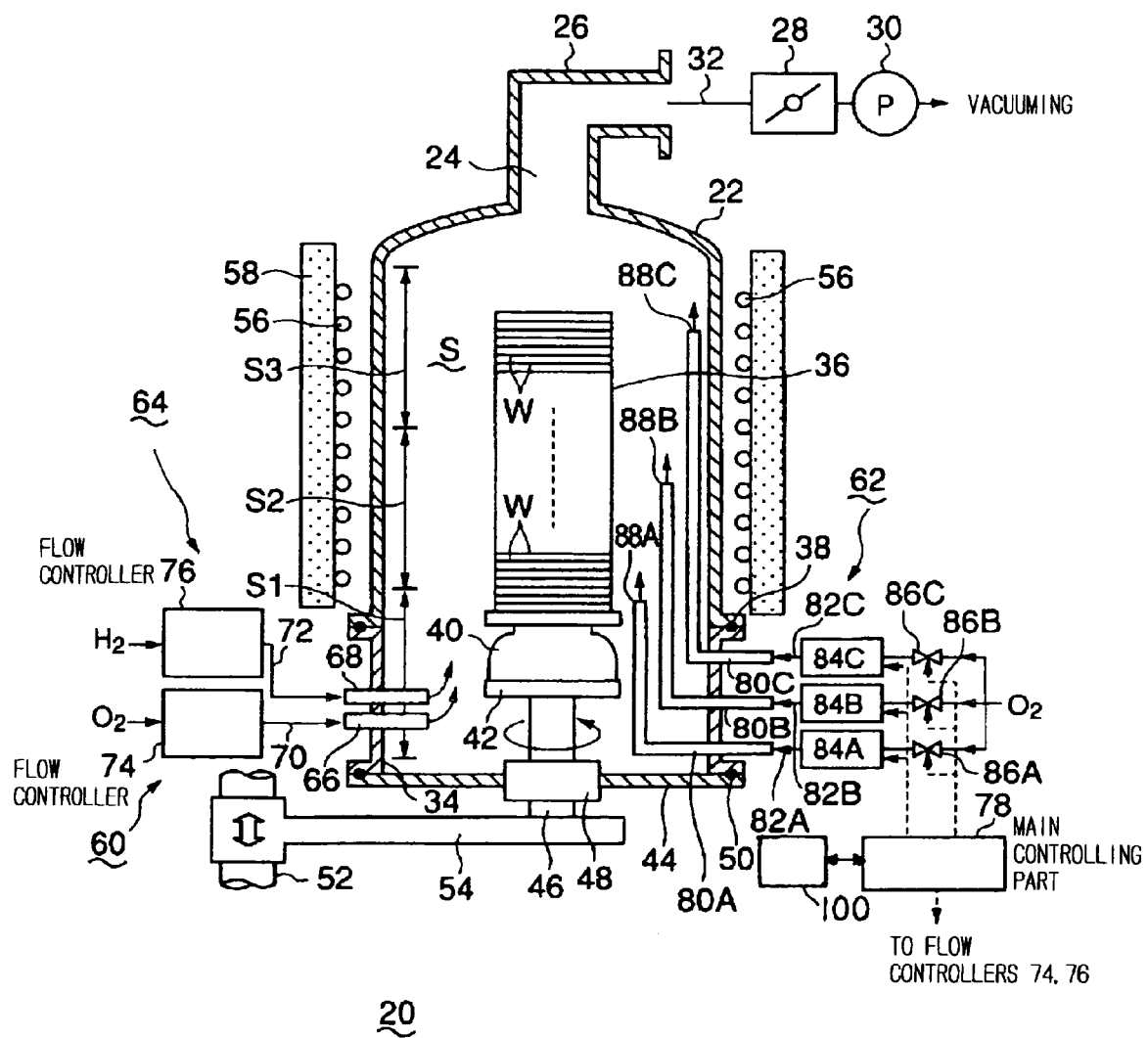
FIG. 1 is a schematic structural view showing an embodiment of an oxidizing unit according to the present invention.

FIG. 1 is a schematic structural view showing the embodiment of an oxidizing unit according to the present invention.

As shown in FIG. 1, an oxidizing unit 20 according to the embodiment of the invention has a cylindrical processing container 22 whose lower end is open. The processing container 22 may be made of for example quartz whose heat resistance is high. The processing container 22 has a predetermined length.

An open gas-discharging port 24 is provided at a ceiling part of the processing container 22. A gas-discharging line 26 that has been bent at a right angle in a lateral direction is provided to connect with the gas-discharging port 24. A gas-discharging system 32 including a pressure-control valve 28 and a vacuum pump 30 and the like on the way is connected to the gas-discharging line 26. Thus, the atmospheric gas in the processing container 22 can be discharged. Herein, the inside of the processing container 22 may be a vacuum or a substantially normal-pressure atmosphere, depending on a process manner.

A lower end of the processing container 22 is supported by a cylindrical manifold 34 made of for example stainless steel. Under the manifold 34, a wafer boat 36 made of quartz as a holding unit, on which a large number of semiconductor wafers W as objects to be processed are placed in a tier-like manner at a predetermined pitch, is provided in a vertically movable manner. The wafer boat 36 can be inserted into and taken out from the processing container 22, through a lower opening of the manifold 34 In the embodiment, for example about 50 wafers W having a 300 mm diameter may be supported in a tier-like manner at substantially the same interval (pitch) by the wafer boat 36. A sealing member 38 such as an O-ring is interposed between a lower end of the processing container 22 and an upper end of the manifold 34. Thus, airtightness between the processing container 22 and the manifold 34 is maintained.

The wafer boat 36 is placed above a table 42 via a heat-insulating cylinder 40 made of quartz. The table 42 is supported on a top part of a rotation shaft 28 that penetrates a lid member 44 for opening and closing the lower end opening of the manifold 34.

For example, a magnetic-fluid seal 48 is provided at a penetration part of the lid member 44 by the rotation shaft 28. Thus, the rotation shaft 28 can rotate while maintaining airtightness by the lid member 44. In addition, a sealing member 50 such as an O-ring is provided between a peripheral portion of the lid member 44 and a lower end portion of the manifold 34. Thus, airtightness between the lid member 44 and the manifold 34 is maintained, so that airtightness in the processing container 22 is maintained.

The rotation shaft 28 is attached to a tip end of an arm 54 supported by an elevating mechanism 52 such as a boat elevator. When the elevating mechanism 52 is moved up and down, the wafer boat 36 and the lid member 44 and the like may be integrally moved up and down.

Herein, the table 42 may be fixed on the lid member 44. In the case, the wafer boat 36 doesn't rotate while the process to the wafers W is conducted.

A heating unit 56, which consists of for example a heater made of a carbon-wire disclosed in JP A 2003-209063, is provided at a side portion of the processing container 22 so as to surround the processing container 22. The heating unit 56 is capable of heating the semiconductor wafers W located in the processing container 22. The carbon-wire heater can achieve a clean process, and is superior in characteristics of rise and fall of temperature.

A heat insulating material 58 is provided around the outside periphery of the heating unit 56. Thus, the thermal stability of the heating unit 56 is assured.

In addition, various gas-supplying units are provided at the manifold 34, in order to introduce various kinds of gases into the processing container 22.

Specifically, at the manifold 34, a main oxidative-gas supplying unit 60 and an accessory (sub) oxidative-gas supplying unit 62 that supply an oxidative gas into the processing container 22, and a reducing-gas supplying unit 64 that supplies a reducing gas into the processing container 22 are respectively provided.

The main oxidative-gas supplying unit 60 has an oxidative-gas ejecting nozzle 66 that pierces the side wall of the manifold 34. The reducing-gas supplying unit 64 has a reducing-gas ejecting nozzle 68 that pierces the side wall of the manifold 34. A tip portion of the oxidative-gas ejecting nozzle 66 and a tip portion of the reducing-gas ejecting nozzle 68 are located in an area on a lower end side in the processing container 22. On the way of a gas passage 70 extending from the oxidative-gas ejecting nozzle 66, a flow-rate controller 74 such as a mass flow controller is provided. On the way of a gas passage 72 extending from the reducing-gas ejecting nozzle 68, a flow-rate controller 76 such as a mass flow controller is provided. A main controlling part 78 consisting of a micro computer or the like is adapted to control the flow-rate controllers 74, 76 to control supply flow rates of the oxidative gas and the reducing gas into the processing container 22.

The main controller 78 has also a function of controlling the whole operation of the oxidizing unit 20. The operation of the oxidizing unit 20, which is described below, is carried out based on commands from the main controller 78. In addition, the main controller 78 has a storage medium 100 such as a floppy disk or a flash memory in which a program for carrying out various control operations has been stored in advance. Alternatively, the main controller 78 is connected (accessible) to the storage medium 100.

In addition, the accessory oxidative-gas supplying unit 62 as a feature of the present invention is provided on a way in a longitudinal direction of the processing container 22. In the shown example, as the accessory oxidative-gas supplying unit 62, three (a plurality of) accessory nozzles 80A, 80B and 80C are provided, each of which penetrates the side wall of the manifold 34. Each accessory nozzle 80A to 80C is bent upwardly in a L-shape in the processing container 22. Tip portions of the accessory nozzles 80A to 80C are formed as gas ejecting ports 88A, 88B and 88C. The respective gas ejecting ports 88A to 88C are arranged at different positions in the longitudinal (vertical) direction of the processing container 22.

On the ways of respective gas passages 82A, 82B and 82C extending from the respective accessory nozzles 80A to 80C, flow-rate controller 84A, 84B and 84C such as mass flow controllers and open-close valves 86A, 86B and 86C are provided. The main controller 78 is adapted to control the flow-rate controllers 84A, 84B, and 84C and the open-close valves 86A, 86B and 86C in order to independently control respective accessory flow rates of the oxidative gas into the processing container 22, including to stop the supply.

In the shown example, a containing area S of the wafers W in the processing container 22 is conceptionally divided into three zones along a gas flow direction (longitudinal direction), that is, an upstream zone S1, a midstream zone S2, and a downstream zone S3. The gas ejecting ports 88A to 88C are respectively located at the flow zones S1 to S3.

More specifically, in the shown example, the gases introduced into the processing container 22 flow upwardly in the containing area S from the introduction positions, and go out through the gas-discharging port 24 provided at the upper end portion of the processing container 22. Then, the containing area S of the wafers W is set to be a little larger in a vertical direction than a length of the wafer boat 36, and is exponentially divided into the three zones along the gas flow direction, that is, the upstream zone S1 (lower zone in FIG. 1), the midstream zone S2 (mid zone in FIG. 1), and the downstream zone S3 (upper zone in FIG. 1).

Then, as shown in FIG. 1, the gas ejecting port 88A of the shortest accessory nozzle 80A is located in the upstream zone S1. More specifically, it is preferable that the gas ejecting port 88A is located in the vicinity of a lower end of the wafer boat 36. In addition, it is preferable that the gas ejecting port 88B of the accessory nozzle 80B is located at a substantial center of the midstream zone S2, that the gas ejecting port 88C of the longest accessory nozzle 80C is located in the downstream zone S3 at a position a little lower than an upper end of the wafer boat 36.

The above areal division is only an example. The number of divided zones may be smaller and larger, and an accessory nozzle may be provided in each zone. In addition, for example, an $O_2$ gas may be used as the oxidative gas, and an $H_2$ gas may be used as the reducing gas. In addition, if necessary, an inert-gas supplying unit, which is not shown but supplies an inert gas such as an $N_2$ gas, may be provided.

Next, an oxidizing method carried out by using the oxidizing unit 20 is explained. As described above, the operations of the oxidizing unit 20 are carried out based on the commands from the main controller 78 based on the program stored in the storage medium 100.

When the semiconductor wafers W consisting of for example silicon wafers are unloaded and the oxidizing unit 20 is under a waiting state, the processing container 22 is maintained at a temperature, which is lower than a process temperature. Then, the wafer boat 36 on which a large number of, for example fifty, wafers W (production wafers) of a normal temperature are placed is moved up and loaded into the processing container 22 in a hot-wall state from the lower portion thereof. The lid member 44 closes the lower end opening of the manifold 34, so that the inside of the processing container 22 is hermetically sealed. As described above, in each of the semiconductor wafers as the objects to be processed, both a silicon layer and a silicon nitride layer are exposed, which have been patterned in advance. Herein, the silicon layer may include a surface of a silicon substrate itself.

Then, the inside of the processing container 22 is vacuumed and maintained at a predetermined process pressure. On the other hand, electric power supplied to the heating unit 56 is increased so that the wafer temperature is raised and stabilized at a process temperature for the oxidation process. After that, predetermined process gases, herein the $O_2$ gas and the $H_2$ gas, are respectively supplied from the gas ejecting nozzle 66 of the main oxidative-gas supplying unit 60 and the accessory nozzles 80A to 80C of the accessory oxidative-gas supplying unit 62 and the reducing-gas ejecting nozzle 68 of the reducing-gas supplying unit 72 into the processing container 22 while the flow rates of the gases are controlled.

The both gases ascend in the processing container 22 and react on each other in a vacuum atmosphere in order to generate the active hydroxyl species and the active oxygen species. The active species come in contact with the wafers W contained in the rotating wafer boat 36. Thus, a selective oxidation process is conducted to the wafer surfaces. That is, thick $SiO_2$ films are formed on the silicon layers, and thin $SiO_2$ films are formed on the silicon nitride layers. Then, the respective process gases and a reaction product gas are discharged outside from the gas-discharging port 24 at the ceiling part of the processing container 22.

The flow rate of the $H_2$ gas is within 200 to 5000 sccm, for example 1800 sccm. The flow rate of the $O_2$ gas is within 50 to 10000 sccm, for example 400 sccm.

As described above, the $H_2$ gas and the $O_2$ gas separately introduced into the processing container 22 ascend in the processing container 22 of a hot-wall state, cause a burning reaction of hydrogen in the vicinity of the wafers W, and form an atmosphere mainly consisting of the active oxygen species (O*) and the active hydroxyl species (OH*). These active species oxidize the surfaces of the wafers W so that $SiO_2$ films are formed.

Regarding the process condition at that time, the wafer temperature is within 400 to 1000° C., for example 900° C., and the pressure is within 13.3 to 1330 Pa, for example 133 Pa (1 Torr). In addition, the processing time is for example about 10 to 30 minutes although it depends on a film thickness of the formed film.

Herein, a forming process of the active species is thought as follows. That is, since the hydrogen and the oxygen are separately introduced into the processing container 22 of a hot-wall state under a reduced-pressure atmosphere, it may be thought that the following burning reaction of the hydrogen is promoted near to the wafers W. In the following expressions, chemical symbols with a mark "*" mean active species thereof.

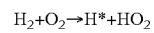

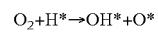

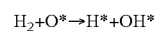

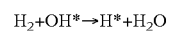

As described above, when the $H_2$ gas and the $O_2$ gas are separately introduced into the processing container 22, the O* (active oxygen species) and the OH* (active hydroxyl species) and the $H_2O$ (moisture vapor) are generated during the burning reaction of the hydrogen. These (O*, OH*, $H_2O$) oxide the wafer surfaces, so that the $SiO_2$ films are selectively formed. At that time, in particular, it is thought that the O* and the OH* greatly contribute to the oxidation effect.

Herein, in the present embodiment, from the respective accessory nozzles 80A to 80C, the $O_2$ gas is supplied to the respective corresponding zones (the upstream zone S1, the midstream zone S2 and the downstream zone S3) in the containing zone S at respective necessary flow rates. The $O_2$ gas reacts on the $H_2$ gas ascending in the processing container 22 serially. Then, as shown by the above expressions, in order to compensate a shortage of the active oxygen species and/or the active hydroxyl species because of consumption thereof and/or loss of activity thereof, the active oxygen species and/or the active hydroxyl species are generated. Thus, in a between-surface direction (vertical direction), an appropriate amount of the active species exists in every vertical position. That is, density of the active species may be made uniform. Thus, uniformity between surfaces of a film thickness of oxide films selectively formed on surfaces of silicon layers can be improved.

As a result, in the gate structure consisting of the ONO film as shown in FIG. 12, it can be prevented that the silicon nitride film is thinned. That is, a designed ONO-film structure can be obtained.

Then, an actual selective oxidation process was conducted to wafers, each of which has an exposed Si surface (silicon layer) and an exposed SiN surface (silicon nitride layer). The evaluation result is explained.

<Evaluation Experiment 1>

In the evaluation experiment 1, the accessory oxidative-gas supplying unit 62 was not used. That is, the $O_2$ gas was supplied only from the main oxidative-gas supplying unit 60. Thicknesses of oxide films were measured while density of the $H_2$ gas with respect to the total gas flow rate was changed.

Figure 2:
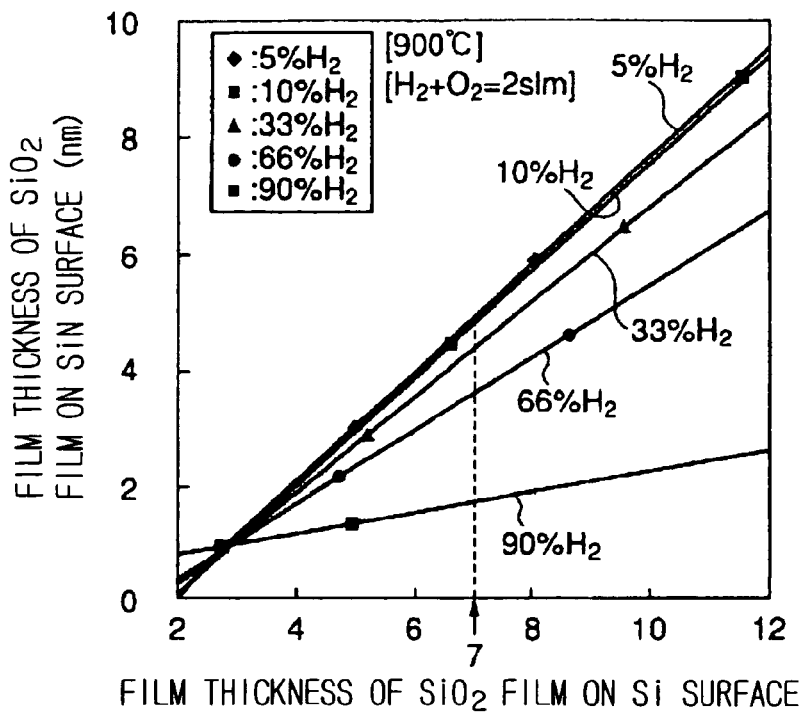
FIG. 2 is a graph showing a relationship between densities of an $H_2$ gas, film thicknesses of oxide films on SiN surfaces, and film thicknesses of oxide films on Si surfaces.
Figure 3:
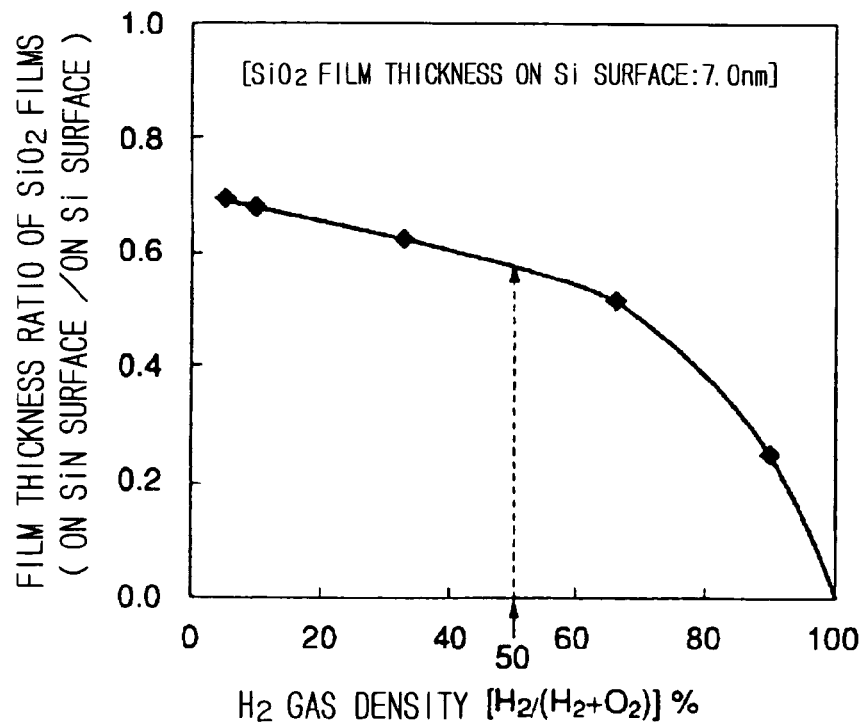
FIG. 3 is a graph showing a relationship between densities of an $H_2$ gas and film thickness ratios (selective ratios), when film thicknesses of oxide films on Si surfaces are 7 nm in FIG. 2.

FIGS. 2 and 3 show the result. FIG. 2 is a graph showing a relationship between densities of the $H_2$ gas, film thicknesses of oxide films on SiN surfaces, and film thicknesses of oxide films on Si surfaces. FIG. 3 is a graph showing a relationship between densities of the $H_2$ gas and film thickness ratios (selective ratios), when film thicknesses of oxide films on Si surfaces are 7 nm in FIG. 2.

In FIG. 2, the abscissa axis represents a thickness of an $SiO_2$ film on an Si surface (silicon layer), and the longitudinal axis represents a thickness of an $SiO_2$ film on an SiN surface (silicon nitride layer). In FIG. 3, the abscissa axis represents density of the $H_2$ gas $[H_2/(H_2+O_2)]$, and the longitudinal axis represents a film thickness ratio of the oxide films (on SiN surface/on Si surface).

Regarding the process condition of the evaluation experiment 1, the process temperature was 900° C., the process pressure was 47 Pa (0.35 torr), and $H_2+O_2=2.0$ Slm [standard liter per minute] (the total gas flow rate). The density of the $H_2$ gas was changed between 5% and 90%.

As clearly seen from FIGS. 2 and 3, even when the density of the $H_2$ gas is low (for example, about 5%), more (thicker) oxide films are selectively formed on Si surfaces, which are easy to be oxidized. Then, when the density of the $H_2$ gas is higher, gradient of the lines in FIG. 2 is gradually decreased. That is, when the density of the $H_2$ gas is higher, more $SiO_2$ films are formed on Si surfaces, so that the selective ratio is remarkably improved. In particular, as shown in FIG. 3, it was confirmed that the density of the $H_2$ gas is preferably set at not less than 50% in order to make the film thickness ratio (inverse of the selective ratio) not more than 0.55.

Herein, if the density of the $H_2$ gas is 100%, the wafer surfaces are not oxidized. Thus, the density of the $H_2$ gas has to be lower than 100%. Actually, it is preferable that the density of the $H_2$ gas is within a range of 66% to 90%, taking into consideration throughout based on oxidation rate. In this range, it was confirmed that the high selective ratio can be maintained and the high throughput can be secured.

Figure 4:
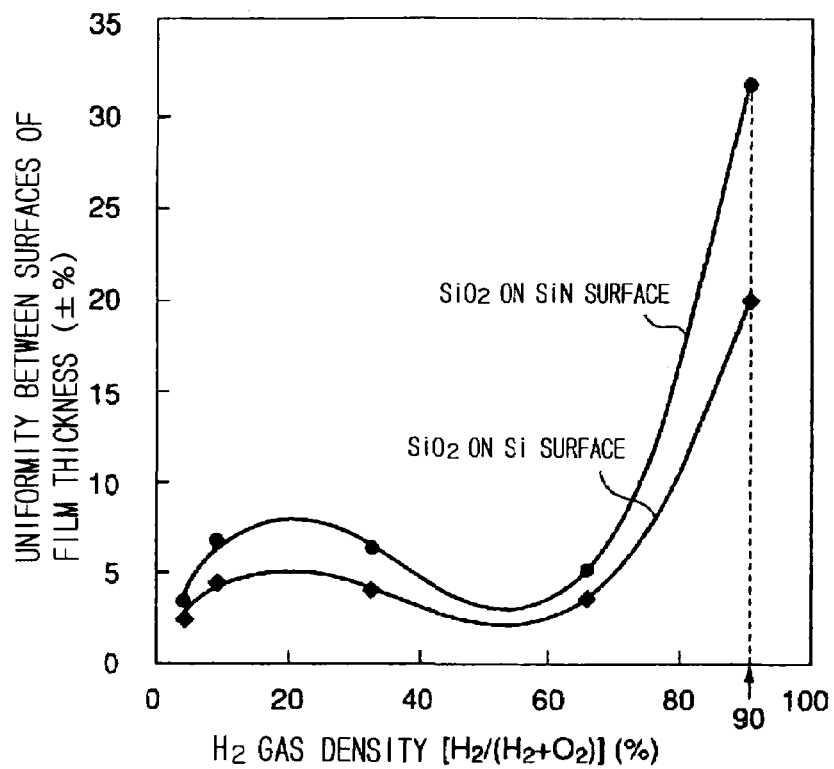
FIG. 4 is a graph showing a relationship between densities of an $H_2$ gas and uniformity between surfaces of a film thickness.
Figure 5:
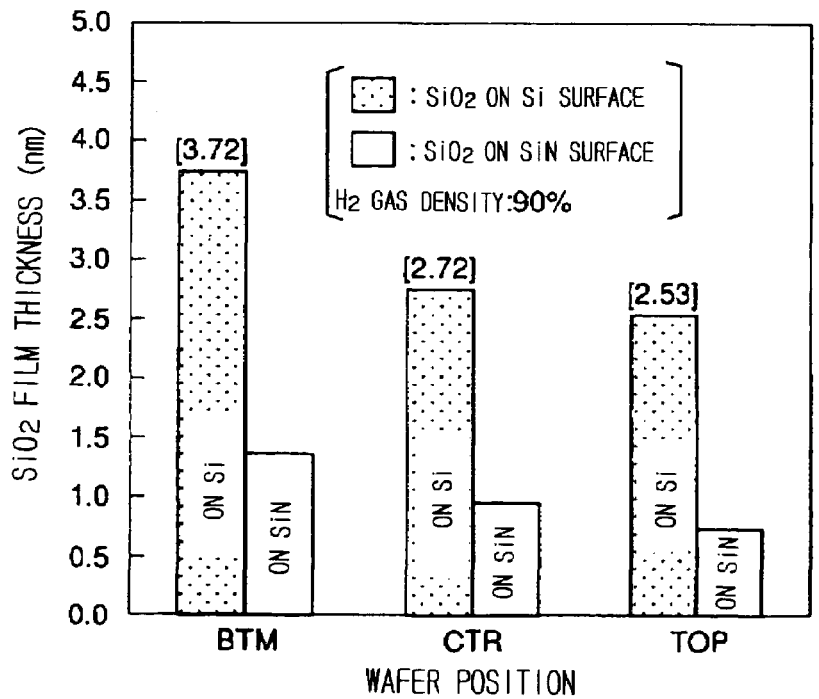
FIG. 5 is a graph showing film thicknesses at respective positions in a wafer boat.

On the other hand, according to the above oxidation process conditions, the selective ratio and the throughput are high enough, but uniformity between surfaces of oxide films is very low. FIGS. 4 and 5 are graphs about the uniformity between surfaces of oxide films. FIG. 4 is a graph showing a relationship between densities of the $H_2$ gas and uniformity between surfaces of a film thickness. FIG. 5 is a graph showing film thicknesses at respective positions in a wafer boat.

In FIG. 4, the abscissa axis represents density of the $H_2$ gas, and the longitudinal axis represents uniformity between surfaces of a film thickness. In FIG. 4, film thicknesses of $SiO_2$ films on Si surfaces and film thicknesses of $SiO_2$ films on SiN surfaces are respectively shown. As seen from FIG. 4, if the density of the $H_2$ gas is not more than 70%, both uniformity between surfaces of a film thickness can be maintained not more than 8%. However, if the density of the $H_2$ gas is more than 70%, both uniformity between surfaces of a film thickness may be remarkably deteriorated. In particular, if the density of the $H_2$ gas is 90%, uniformity between surfaces of a film thickness of $SiO_2$ films on Si surfaces may be increased to about 20%, and uniformity between surfaces of a film thickness of $SiO_2$ films on SiN surfaces may be increased to about 32%. That is, uniformity between surfaces of a film thickness may be deteriorated very much.

In addition, FIG. 5 shows measured values of respective film thicknesses at respective positions of "BTM" (bottom), "CTR" (center) and "TOP" (top) in a wafer boat, when the density of the $H_2$ gas is 90%. The "BTM (bottom)", the "CTR (center)" and the "TOP (top)" correspond to a lower position, a central position and an upper position in a height direction of the wafer boat 36 of FIG. 1.

As seen from FIG. 5, the film thicknesses at respective positions of "BTM", "CTR" and "TOP" are greatly different. That is, it could be confirmed that the uniformity between surfaces of a film thickness is greatly deteriorated. Then, in order to improve the uniformity between surfaces of a film thickness, it could be recognized that it is necessary to increase a film thickness at the "TOP" portion.

<Evaluation Experiment 2>

As described above, in order to improve uniformity between surfaces of a film thickness, it is sufficient to increase a film thickness at the "TOP" portion on the downstream side of the gas flow. Thus, the measures for that purpose were studied.

Herein, dependency of film thicknesses of $SiO_2$ films on densities of the $H_2$ gas was studied. FIG. 6 is a graph showing dependency of film thicknesses of $SiO_2$ films on densities of the $H_2$ gas. The density of the $H_2$ gas was changed within a range of 5% to 90%, and each oxidation process was conducted for 20 minutes. The film thicknesses of formed $SiO_2$ films are shown. As shown in FIG. 6, the film thicknesses of $SiO_2$ films both on Si surfaces and on SiN surfaces are gradually decreased as the density of the $H_2$ gas is increased, in an area not less than 50% of the density of the $H_2$ gas (shown by a broken line in FIG. 6). To the contrary, in the area not less than 50% of the density of the $H_2$ gas, the film thicknesses are larger (the oxidation rate is high) when the density of the $H_2$ gas is lower. Thus, it can be recognized that it is sufficient to relatively reduce the density of the $H_2$ gas by positively supplying the $O_2$ gas, for an area in which increase of a film thickness is desired.

<Evaluation Experiment 3>

As described above, for an area in which increase of a film thickness is desired, it could be recognized that it is sufficient to reduce the density of the $H_2$ gas in the area by positively supplying the $O_2$ gas. Thus, herein, an experiment was conducted wherein the $O_2$ gas was accessorily supplied to a portion in which a film thickness is small in FIG. 5, that is, to the "TOP" area (downstream zone S3 of the gas flow). The result is shown in FIG. 7.

FIG. 7 is a graph showing film thicknesses of $SiO_2$ films on Si surfaces at respective positions in the wafer boat. In FIG. 7, dotted columns represent the standard values (film thicknesses of $SiO_2$ films on Si surfaces of the evaluation experiment 1 (FIG. 5)), and oblique-lined columns represent film thicknesses of oxide films according to the present experiment wherein the $O_2$ gas was accessorily supplied.

In the present experiment, the $O_2$ gas was supplied from the gas ejecting nozzle 66 and the $H_2$ gas was supplied from the gas ejecting nozzle 68. In addition, the $O_2$ gas was supplied from the accessory nozzle 80C to the downstream zone S3 ("TOP") in which increase of a film thickness is desired. At that time, the process pressure and the process temperature were the same as those of the evaluation experiment 1 (FIG. 5). Regarding the gas flow rates, the $H_2$ gas flow rate was 1.8 slm, the $O_2$ gas flow rate from the nozzle 66 was 0.2 slm, and the $O_2$ gas flow rate from the accessory nozzle 80C was 0.2 slm. That is, the density of the $H_2$ gas was 82%.

As clearly seen from FIG. 7, only by accessorily supplying the $O_2$ gas to the "TOP" area, a film thickness at the area was increased from "2.53 nm" to "8.70 nm", about 3.4 times. That is, it could be confirmed that uniformity between surfaces of a film thickness can be improved only by accessorily supplying a small amount of the $O_2$ gas to the area.

Please note that the effect of increasing the film thickness can be also obtained at the "CTR" area and the "BTM" area on the upstream side of the "TOP" area, when the $O_2$ gas is accessorily supplied to the "TOP" area. It can be thought that this is caused by back diffusion of the accessorily supplied $O_2$ gas against the gas flow in the processing container.

From the above result, it was found that uniformity between surfaces of a film thickness can be improved by accessorily supplying the $O_2$ gas from at least one position to an area, preferably to an area in which a film thickness is the smallest, on the way of the gas flow in the processing container 22 while the $O_2$ was supplied from the gas ejecting nozzle 66 and the $H_2$ gas is supplied from the gas ejecting nozzle 68.

<Evaluation Experiment 4>

Figure 8:
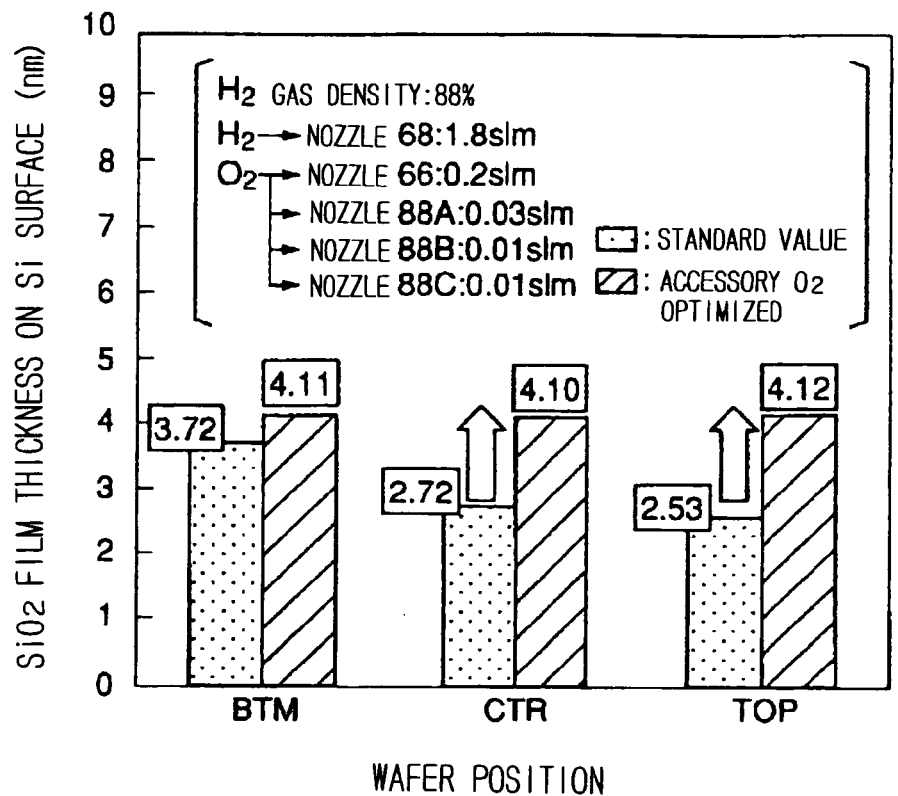
FIG. 8 is a graph showing changes of film thicknesses of $SiO_2$ films on Si surfaces at respective positions in the wafer boat, when an accessory supplying manner of an $O_2$ gas is optimized.

Next, optimization of a supplying manner of the $O_2$ gas was studied. Herein, the oxidizing unit shown in FIG. 1 was used. FIG. 8 is a graph showing film thicknesses of $SiO_2$ films on Si surfaces at respective positions in the wafer boat, when an accessory supplying manner of the $O_2$ gas is optimized. In FIG. 8, dotted columns represent the standard values (film thicknesses of $SiO_2$ films on Si surfaces of the evaluation experiment 1 (FIG. 5)), and oblique-lined columns represent film thicknesses of oxide films according to the present experiment wherein the $O_2$ gas was accessorily optimally supplied.

In the present experiment, the $O_2$ gas was supplied from the gas ejecting nozzle 66 and the $H_2$ gas was supplied from the gas ejecting nozzle 68. In addition, the $O_2$ gas was supplied from the respective accessory nozzles 80A to 80C at respective predetermined flow rates. At that time, the process pressure and the process temperature were the same as those of the evaluation experiment 1 (FIG. 5) and the evaluation experiment 3 (FIG. 7). Regarding the gas flow rates, the $H_2$ gas flow rate was 1.8 slm, the $O_2$ gas flow rate from the nozzle 66 was 0.2 slm, the $O_2$ gas flow rate from the accessory nozzle 80A was 0.03 slm, the $O_2$ gas flow rate from the accessory nozzle 80B was 0.01 slm, and the $O_2$ gas flow rate from the accessory nozzle 80C was 0.01 slm. That is, the density of the $H_2$ gas was 88%.

As clearly seen from FIG. 8, in the total areas of "BTM", "CTR" and "TOP", the film thicknesses are uniformed within a range of 4.10 nm to 4.12 nm. That is, it could be confirmed that uniformity between surfaces of a film thickness of the oxide films can be remarkably improved.

Herein, the supply flow rates of the $O_2$ gas from the respective accessory nozzles 80A to 80C can be controlled independently from each other, including stop of the supply. For example, the supply flow rates may be respectively increased or decreased suitably depending on surface states of the wafers W.

In addition, the wafers used in the evaluation experiment 4 have a simple pattern. However, various patterns may be formed on a surface of an actual production wafer. If a surface area of the wafer is large, the active species may be consumed more accordingly. In addition, the amount of consumed active species may be changed depending on the number of the wafers to undergo the oxidation process. Thus, it is preferable to optimize the flow rates of the $O_2$ gas supplied from the respective accessory nozzles 80A to 80C, depending on dimension of the total surface area of the wafers contained in the processing container 22, that is, depending on magnitude of loading effect.

Figure 9:
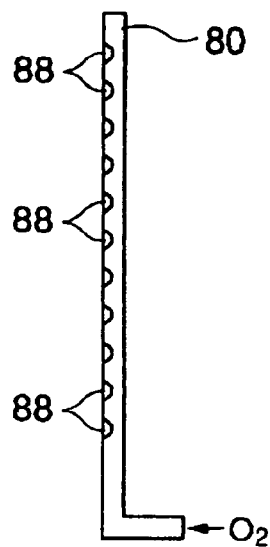
FIG. 9 is a view showing a modified structural example of an accessory nozzle.

Herein, instead of the three accessory nozzles 80A to 80C, for example as shown in FIG. 9, one accessory nozzle 80 having a plurality of gas ejecting ports 88 formed at a predetermined pitch in the longitudinal direction may be provided. The length of the accessory nozzle 80 may be set at a length capable of covering substantially the total length of the wafer boat 36 in the processing container 22. In the case, for example, correspondingly to the respective zones S1 to S3, respective apertures of the gas effecting ports 88 may be differently formed. Thus, the flow rates of the $O_2$ gas for the respective zones may be made different.

In addition, in the example of FIG. 1, the main $O_2$ gas and the $H_2$ gas are supplied from the lower portion of the processing container 22, the upward gas flow is formed in the processing container 22, and the gas flow is adapted to be discharged from the gas-discharging port 24 at the ceiling port of the processing container 22. However, this invention is not limited thereto, another structure shown in FIG. 10 may be also adopted.

Figure 10:
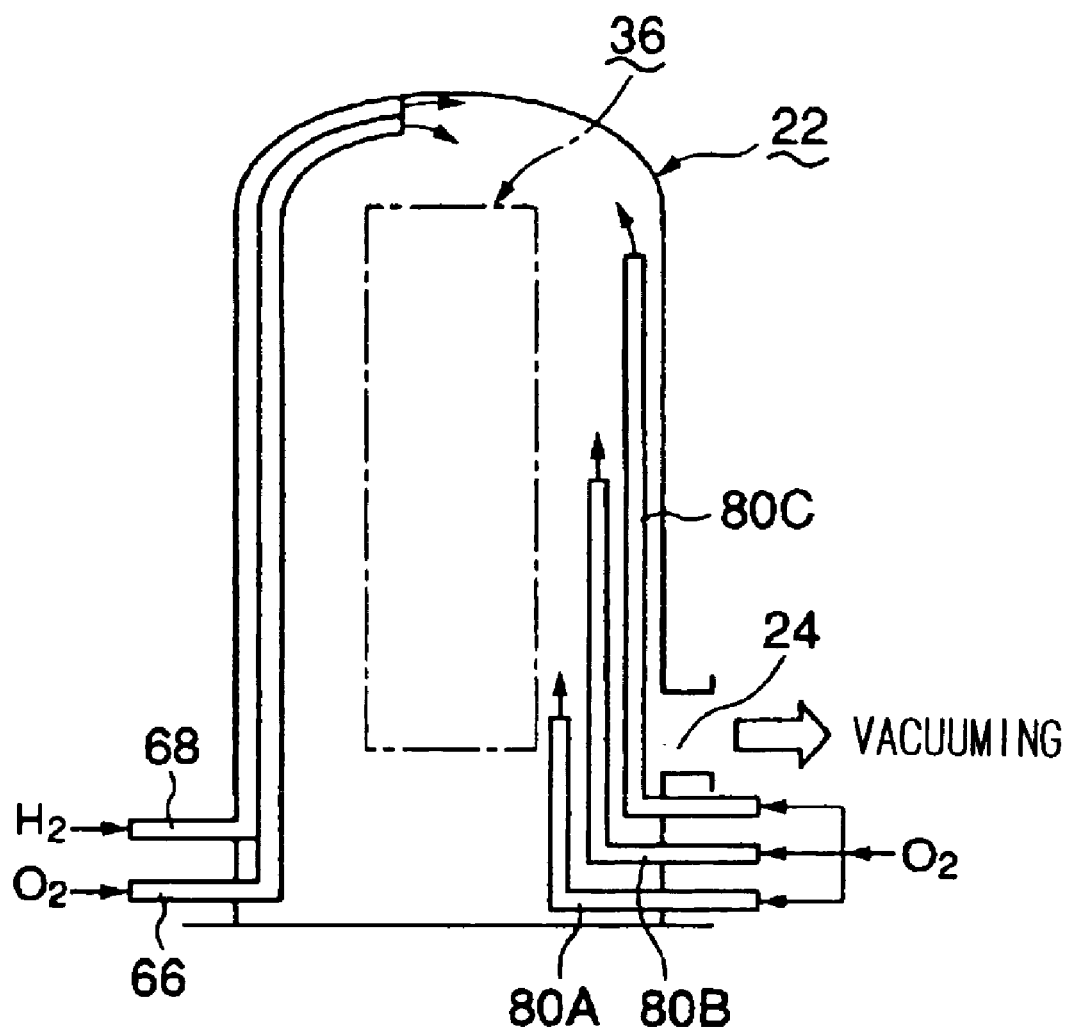
FIG. 10 is a schematic structural view showing another modified embodiment of an oxidizing unit.
Figure 11:
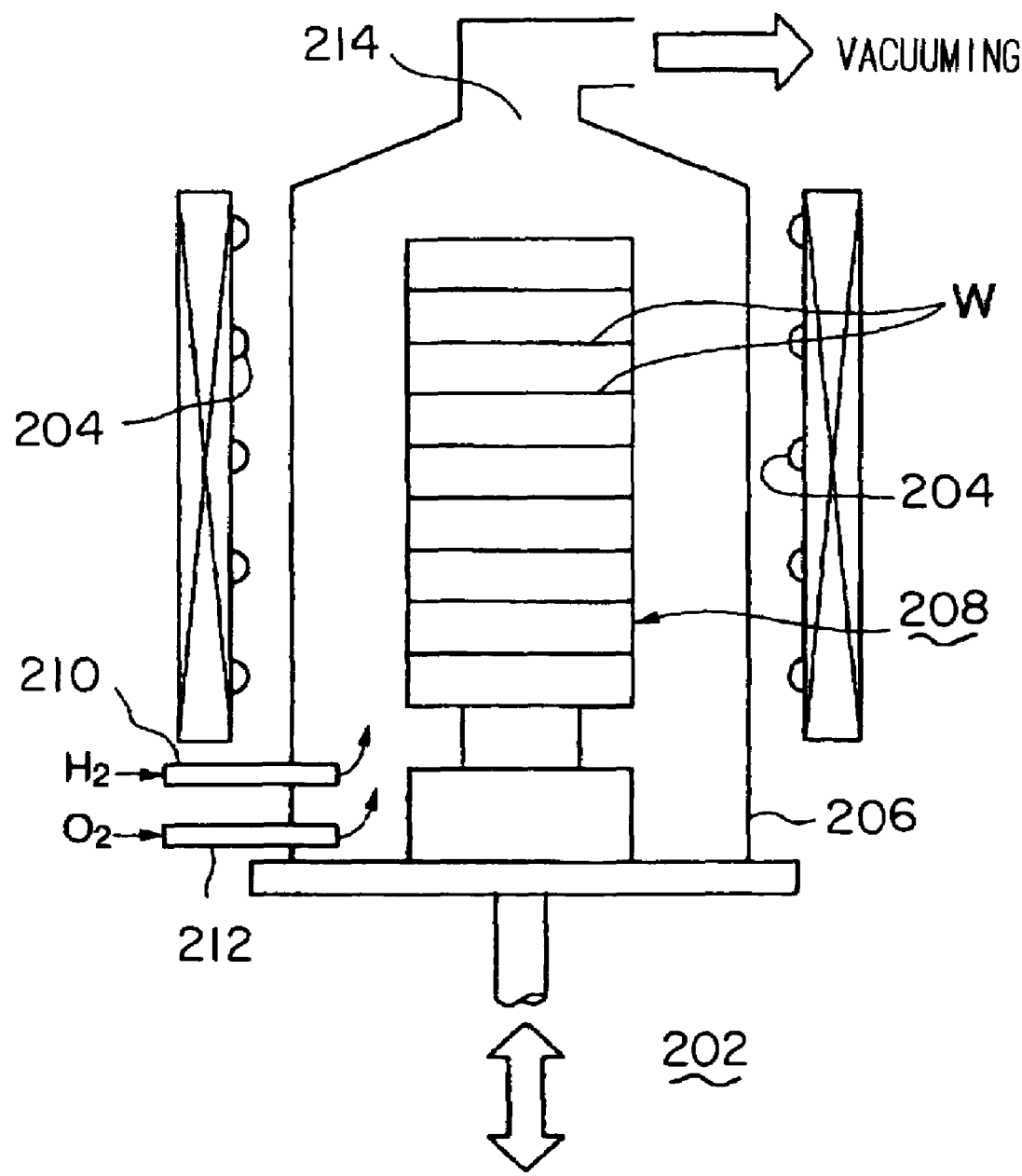
FIG. 11 is a schematic structural view showing a conventional oxidizing unit.

FIG. 10 is a schematic structural view showing a modified embodiment of the oxidizing unit. In the case shown in FIG. 10, the nozzles 66 and 80A supplying the main $O_2$ gas and the $H_2$ gas are respectively arranged along an inside wall of the processing container 22. The gas ejecting ports thereof are arranged at the container ceiling part. Then, the gas-discharging port 24 is provided at a lower side wall, instead of at the container ceiling part. Thus, opposite to the case of FIG. 1, a downward gas flow is formed in the processing container 22.

In the case shown in FIG. 10, the relationship from the upstream zone S3 to the downstream zone S1 shown in FIG. 1 is inversed upside down. In addition, the gas supplying manner from the respective accessory nozzles 80A to 80C is also inversed upside down from the case of FIG. 1.

In addition, in the above embodiments, the $O_2$ gas is used as an oxidative gas. However, this invention is not limited thereto. An $N_2O$ gas, an NO gas, an $NO_2$ gas and the like may be used. In addition, in the above embodiments, the $H_2$ gas is used as a reducing gas. However, this invention is not limited thereto. An $NH_3$ gas, a $CH_4$ gas, an HCl gas and the like may be used.

In addition, this invention is applicable to an LCD substrate, a glass substrate or the like, as an object to be processed, instead of the semiconductor wafer.

The invention claimed is:
1. An oxidizing method for an object to be processed, the oxidizing method comprising:
an arranging step of arranging a plurality of objects to be processed in a processing container whose inside can be vacuumed, the processing container having a predetermined length, a main supplying unit of an oxidative gas and a supplying unit of a reducing gas being provided at one end of the processing container, a sub supplying unit of the oxidative gas being provided on a way in a longitudinal direction of the processing container;

an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere;

wherein in the atmosphere forming step, the oxidative gas is adapted to be supplied from the main supplying unit of the oxidative gas and the sub supplying unit of the oxidative gas.

2. An oxidizing method for an object to be processed according to claim 1, wherein a silicon layer and a silicon nitride layer are exposed on a surface of each object to be processed, and in the oxidizing step, the surface of each object to be processed is selectively oxidized in the atmosphere.

3. An oxidizing method for an object to be processed according to claim 1, wherein density of the reducing gas in total of the oxidative gas and the reducing gas is between 50% and 100%.

4. An oxidizing method for an object to be processed according to claim 1, wherein the inside of the processing container is divided into at least three zones in the longitudinal direction, three sub supplying units of the oxidative gas are respectively provided for the three zones, and in the atmosphere forming step, the oxidative gas is adapted to be supplied from at least one of the main supplying unit of the oxidative gas and the three sub supplying units of the oxidative gas.

5. An oxidizing method for an object to be processed according to claim 4, wherein in the atmosphere forming step, the three sub supplying units of the oxidative gas are adapted to be controlled independently from each other.

6. An oxidizing method for an object to be processed according to claim 1, wherein the oxidative gas includes one or more gases selected from a group consisting of $O_2$, $N_2O$, $NO$, $NO_2$ and $O_3$, and the reducing gas includes one or more gases selected from a group consisting of $H_2$, $NH_3$, $CH_4$, $HCl$ and deuterium.

7. A storage medium capable of being read by a computer, storing software for controlling an oxidizing method for an object to be processed, the oxidizing method comprising:

an arranging step of arranging a plurality of objects to be processed in a processing container whose inside can be vacuumed, the processing container having a predetermined length, a main supplying unit of an oxidative gas and a supplying unit of a reducing gas being provided at one end of the processing container, a sub supplying unit of the oxidative gas being provided on a way in a longitudinal direction of the processing container;

an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere;

wherein in the atmosphere forming step, the oxidative gas is adapted to be supplied from the main supplying unit of the oxidative gas and the sub supplying unit of the oxidative gas.

* * * * *